(12) United States Patent
Haruki et al.

(10) Patent No.: US 8,860,486 B2
(45) Date of Patent: Oct. 14, 2014

(54) SEMICONDUCTOR DEVICE

(71) Applicant: Kabushiki Kaisha Toshiba, Tokyo (JP)

(72) Inventors: Satoshi Haruki, Kanagawa (JP); Osamu Takata, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/915,552

(22) Filed: Jun. 11, 2013

(65) Prior Publication Data

US 2014/0145780 A1    May 29, 2014

(30) Foreign Application Priority Data

Nov. 28, 2012 (JP) .................................. 2012-260277

(51) Int. Cl.
*H03K 5/08* (2006.01)
*H03K 17/16* (2006.01)

(52) U.S. Cl.
CPC .................................. *H03K 17/162* (2013.01)
USPC .......................... 327/309; 327/325; 327/384

(58) Field of Classification Search
USPC ......................................... 327/309, 325, 384
See application file for complete search history.

(56) References Cited

U.S. PATENT DOCUMENTS

| 5,361,008 A * | 11/1994 | Saijo ............................ 327/427 |
| 5,497,285 A | 3/1996 | Nadd |
| 7,453,308 B2 * | 11/2008 | Tihanyi ........................ 327/309 |
| 2011/0043955 A1 | 2/2011 | Noda |

FOREIGN PATENT DOCUMENTS

| JP | H04-056163 | 2/1992 |
| JP | 07-106565 | 4/1995 |

* cited by examiner

*Primary Examiner* — John Poos
(74) *Attorney, Agent, or Firm* — Patterson & Sheridan, LLP

(57) ABSTRACT

According to one embodiment, a semiconductor device has a transistor comprising a source electrode, a drain electrode, and a gate electrode, a diode and a switch element connected in series between the gate and source electrodes of the transistor, and a control circuit configured to supply a control signal for switching the switch element. The control circuit has a predetermined time constant and is configured to supply the control signal to the switch element if a pulse signal having a voltage that is equal to or higher than a predetermined voltage is supplied to the gate electrode of the transistor.

19 Claims, 3 Drawing Sheets

US 8,860,486 B2

SEMICONDUCTOR DEVICE

CROSS-REFERENCE TO RELATED APPLICATION

This application is based upon and claims the benefit of priority from Japanese Patent Application No. 2012-260277, filed Nov. 28, 2012, the entire contents of which are incorporated herein by reference.

FIELD

Embodiments described herein relate generally to a semiconductor device provided with gate protection diodes.

BACKGROUND

HV (high voltage) screening is practiced for avoiding shipment of semiconductor devices having low reliability. For example, there is a screening method which applies a voltage that is higher than a voltage normally used in operation to gate electrodes of output MOS transistors and intentionally breaks such output MOS transistors which have low-quality gate oxide film so as to eliminate low-quality semiconductor devices before the devices are shipped. Thus, the screening method also includes a test for checking whether a semiconductor device after application of high voltage can normally function or not, a test for checking the presence or absence of leakage current, and other tests to determine the semiconductor device as a good product or a faulty product.

As described above, the HV screening requires the application of high voltage to gate electrodes of output MOS transistors. In the case of output MOS transistors being provided with gate protection diodes, however, the gate protection diodes clamp voltage between the gate and source electrodes and the high voltage may not be applied to the gate electrodes of the output MOS transistors. For solving this problem, switch elements are connected to the gate protection diodes and the high voltage is applied after the switch elements are turned off.

DETAILED DESCRIPTION

In general, embodiments provide a semiconductor device with which the HV screening can be conducted without increasing external terminals used exclusively for the HV screening even if the semiconductor device has gate protection diodes.

According to one embodiment, a semiconductor device has, a transistor comprising a source electrode, a drain electrode, and a gate electrode, a diode and a switch element connected in series between the gate and source electrodes of the transistor, and a control circuit configured to supply a control signal for switching the switch element. The control circuit has a predetermined time constant and is configured to supply the control signal to the switch element if a pulse signal having a voltage that is equal to or higher than a predetermined voltage is supplied to the gate electrode of the transistor.

A semiconductor device and a screening method for the semiconductor device according to exemplary embodiments are hereinafter described in detail with reference to the accompanying drawings. These embodiments should not be considered in any restrictive sense.

First Embodiment

Figure 1:
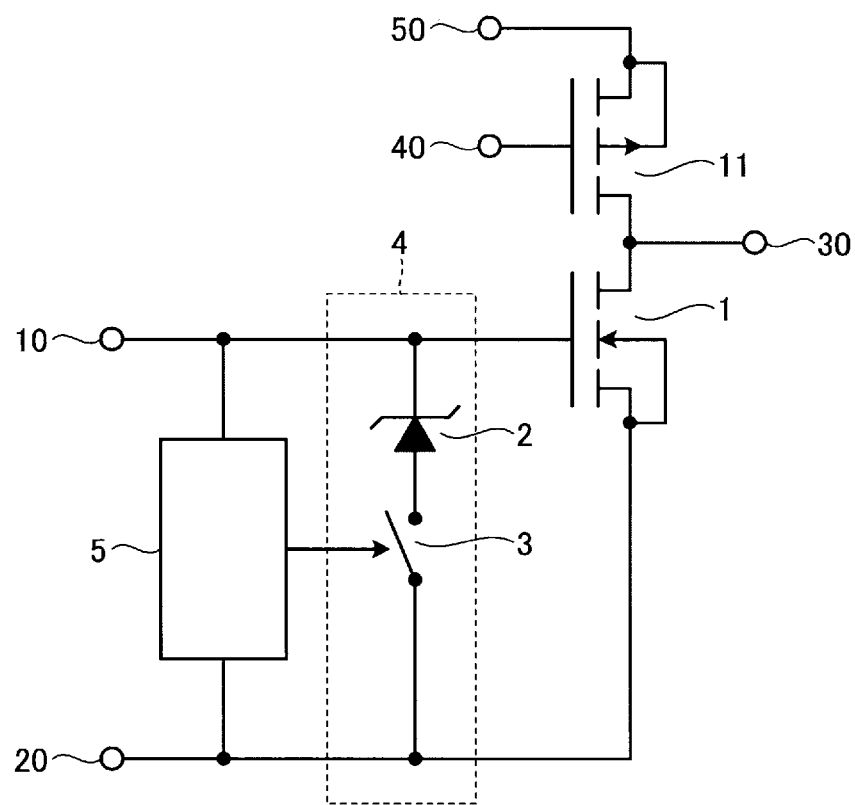
FIG. 1 is a circuit diagram showing a semiconductor device according to a first embodiment.

FIG. 1 illustrates a circuit diagram showing a semiconductor device according to a first embodiment. The semiconductor device in this embodiment includes an N-type DMOS transistor 1 as a power output element which has a gate electrode, a source electrode, and a drain electrode. The gate electrode of the N-type DMOS transistor 1 is connected to a first terminal 10. The first terminal 10 receives an output signal from an internal circuit (not shown) which outputs a driving signal for driving the N-type DMOS transistor 1. The source electrode of the N-type DMOS transistor 1 is connected to a second terminal 20. The second terminal 20 receives a low potential reference voltage (ground potential Vss). The drain electrode of the N-type DMOS transistor 1 is connected to a third terminal 30. The third terminal 30 supplies the output from the N-type DMOS transistor 1. The third terminal is connected to the drain electrode of a P-type DMOS transistor 11. The source electrode of the P-type DMOS transistor 11 is connected to a fifth terminal 50 which receives high potential voltage (Vdd), and the gate electrode of the P-type DMOS transistor 11 is connected to a fourth terminal 40. The fourth terminal 40 receives a driving signal from the internal circuit (not shown). The N-type DMOS transistor 1 operates as a low potential side power output element, while the P-type DMOS transistor 11 operates as a high potential side power output element.

A series circuit 4 constituted by a zener diode 2 for gate protection and a switch element 3. The switch element 3 is connected between the gate and source electrodes of the N-type DMOS transistor 1. The cathode electrode of the zener diode 2 for gate protection is connected to the gate electrode of the N-type DMOS transistor 1, and the anode electrode is connected to the source electrode of the N-type DMOS transistor 1 via the switch element 3.

Furthermore, a control circuit 5 having a predetermined time constant connects between the gate and source electrodes of the N-type DMOS transistor 1. The control circuit 5 has a fixed time constant, and supplies a control signal for controlling on and off of the switch element 3 to the switch element 3 in response to a voltage applied to the first terminal 10, i.e., a signal applied to the gate electrode of the N-type DMOS transistor 1. Specifically, when the first terminal 10 receives a high-voltage pulse signal for the HV screening, the control circuit 5 supplies a control signal for turning off the switch element 3 to the switch element 3 in response to rising of the pulse signal. In the off condition of the switch element 3, the impedance between the anode electrode of the zener diode 2 for gate protection and the second terminal 20 is high. Under this condition, the zener diode 2 for gate protection does not clamp the voltage between the gate and source electrodes of the N-type DMOS transistor 1. Thus, the gate electrode of the N-type DMOS transistor 1 can receive high voltage for the HV screening by applying the high voltage to the first terminal 10.

High-voltage pulses for the HV screening are produced by applying voltage, which is higher than the voltage (Vdd) that is generally used as power-supply voltage applied to a power source terminal, to increase the voltage of the driving signal for the N-type DMOS transistor 1 output from the internal circuit (not shown) to a desired value. For example, if the power-supply voltage generally used is 5 volts (V), the power source voltage for the HV screening is set to 7 volts (V).

After an elapse of a predetermined time, the control circuit 5 supplies a signal for turning on the switch element 3 to the switch element 3. When the switch element 3 is turned on, the impedance between the anode electrode of the zener diode 2 and the second terminal 20 becomes low. In this condition, the zener diode 2 clamps the voltage between the gate and source electrodes of the N-type DMOS transistor 1. Therefore, the zener diode 2 functions as a gate protection diode for the N-type DMOS transistor 1.

According to this embodiment, the control circuit responds to the pulse signal applied to the gate electrode of the N-type DMOS transistor 1, and controls on and off of the switch element 3 connected to the gate protection element (the zener diode 2). Accordingly, the gate electrode of the N-type DMOS transistor 1 connecting with the zener diode 2 for gate protection can receive high-voltage pulses for the HV screening of the semiconductor device without using a special external terminal for controlling the switch element 3. After the application of the high voltage for the HV screening, screening processes as follow are conducted: a test for checking whether the semiconductor device normally functions, a test for checking the presence or absence of leakage current, and other tests to determine the semiconductor device as a good product or a faulty product.

Figure 2:
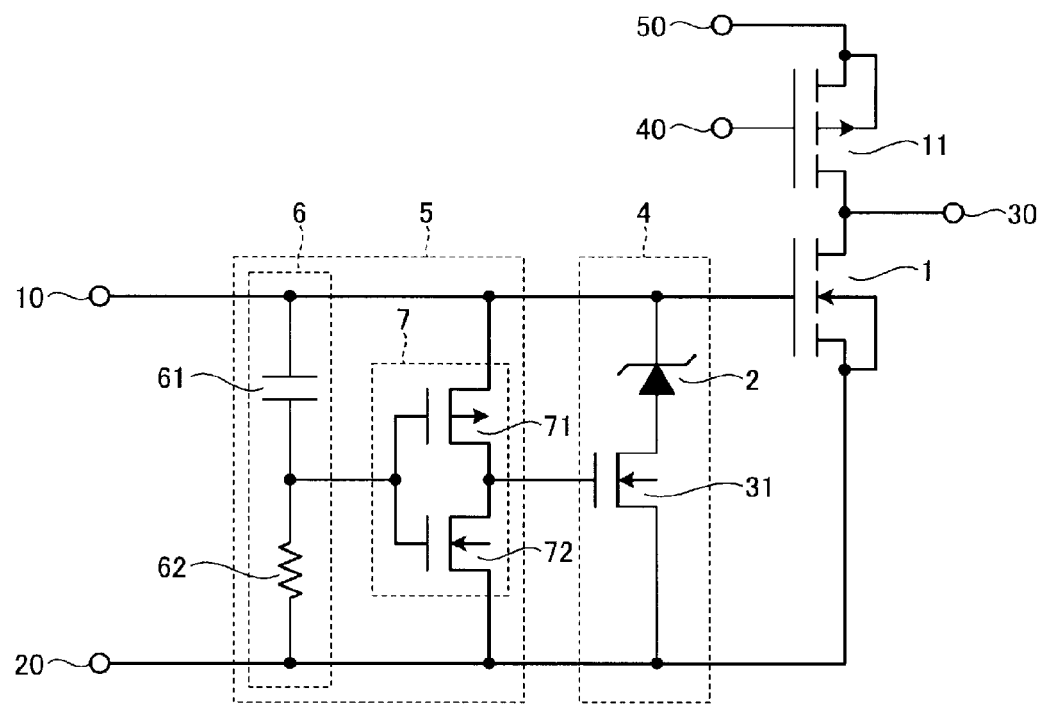
FIG. 2 is a detailed circuit diagram showing the semiconductor device of the first embodiment.

FIG. 2 is a detailed circuit diagram showing the semiconductor device according to the first embodiment. The control circuit 5 includes a bias circuit 6 and a switching circuit 7. The bias circuit 6 has a capacitor 61 and a resistor 62 connected in series between the first terminal 10 and the second terminal 20. The switching circuit 7 has a CMOS inverter circuit constituted by a PMOS transistor 71 and an NMOS transistor 72. The source electrode of the PMOS transistor 71 is connected to the first terminal 10. The drain electrode of the PMOS transistor 71 is connected to the drain electrode of the NMOS transistor 72, and the source electrode of the NMOS transistor 72 is connected to the second terminal 20. The gate electrodes of the PMOS transistor 71 and the NMOS transistor 72 have common connection which is connected to the connections of the capacitor 61 and the resistor 62 of the bias circuit 6.

The series circuit 4 having the zener diode 2 for gate protection and an NMOS transistor 31 connects between the gate and source electrodes of the N-type DMOS transistor 1. The source electrode of the NMOS transistor 31 is connected to the second terminal 20, and the drain electrode of the NMOS transistor 31 is connected to the anode electrode of the zener diode 2. The cathode electrode of the zener diode 2 is connected to the gate electrode of the N-type DMOS transistor 1. In this structure, series connection of the zener diode 2 and the source and drain channels of the NMOS transistor 31 connects between the gate and source electrodes of the N-type DMOS transistor 1. The output of the switching circuit 7 enters the gate electrode of the NMOS transistor 31. The third terminal 30 is connected to the drain electrode of the P-type DMOS transistor 11. The source electrode of the P-type DMOS transistor 11 is connected to the fifth terminal 50 which receives high-potential voltage (Vdd), and the gate electrode of the P-type DMOS transistor 11 is connected to the fourth terminal 40. The fourth terminal 40 receives a driving signal from the internal circuit (not shown). The N-type DMOS transistor 1 operates as a low potential side power output element, and the P-type DMOS transistor 11 operates as a high voltage side power output element.

The series circuit of the capacitor 61 and the resistor 62 constituting the bias circuit 6 forms a differentiating circuit. Assuming that the capacity of the capacitor 61 is C farad (F) and that the resistance of the resistor 62 is R ohm ($\Omega$), the time constant of the bias circuit 6 is calculated as C×R. The bias circuit 6 constituting the differentiating circuit responds to the voltage applied to the first terminal 10, i.e., the pulse signal applied to the gate electrode of the N-type DMOS transistor 1. When a pulse signal having a voltage of E volt (V) is applied to the first terminal 10, the bias circuit 6 responds to rising of the pulse signal, whereby current which has an initial value of (E/R) ampere (A) and decreases according to an exponential function of the time constant (C×R) flows in the resistor 62. When the voltage drop at the resistor 62 caused by the flow of the current exceeds the threshold of the NMOS transistor 72 at which a current flows between the drain and the source, the NMOS transistor 72 is turned on, whereupon a low level output signal is supplied from the switching circuit 7 to the gate electrode of the NMOS transistor 31. By using the switching circuit 7 constituted by the CMOS inverter circuit, a signal whose waveform is shaped into high level or low level can be supplied to the gate electrode of the NMOS transistor 31 constituting the switch element. When the low level output signal is applied to the gate electrode of the NMOS transistor 31, the NMOS transistor is turned off. Under the off condition of the NMOS transistor 31, the impedance between the anode electrode of the zener diode 2 for gate protection and the second terminal 20 is high. In this condition, the zener diode 2 does not clamp the voltage between the gate and source electrodes of the N-type DMOS transistor 1. Accordingly, the gate electrode of the N-type DMOS transistor 1 can receive high voltage for the HV screening by application of high voltage for the HV screening to the first terminal 10. After the application of high voltage for the HV screening, the screening processes as follow are conducted: a test for checking whether the semiconductor device normally functions or not, a test for checking the presence or absence of leakage current, and other tests to determine the semiconductor as a good product or a faulty product.

When the voltages at both ends of the capacitor 61 of the bias circuit 6 increase according to an exponential function and exceed the threshold of the PMOS transistor 71 at which a current flows between the source and the drain, the PMOS transistor 71 is turned on. When the PMOS transistor 71 is turned on, a high level signal is applied to the gate electrode of the NMOS transistor 31. As a result, the NMOS transistor 31 is turned on, whereby the impedance between the anode electrode of the zener diode 2 and the second terminal 20 becomes low. Accordingly, the zener diode 2 clamps the voltage between the gate and source of the N-type DMOS transistor 1.

According to this embodiment, the control circuit responds to the pulse signal applied to the gate electrode of the N-type DMOS transistor 72, and controls on and off of the switch element 31 connected with the zener diode 2 for gate protection. Accordingly, the gate electrode of the N-type DMOS transistor 1 connecting with the zener diode 2 for gate protection can receive high voltage pulses for the HV screening of the semiconductor device without using a special external terminal for controlling the switch element 31. The control circuit 5 having the predetermined time constant controls on and off of the switch element 31 connected with the gate protection element in response to rising of the voltage pulse for the HV screening.

Second Embodiment

Figure 3:
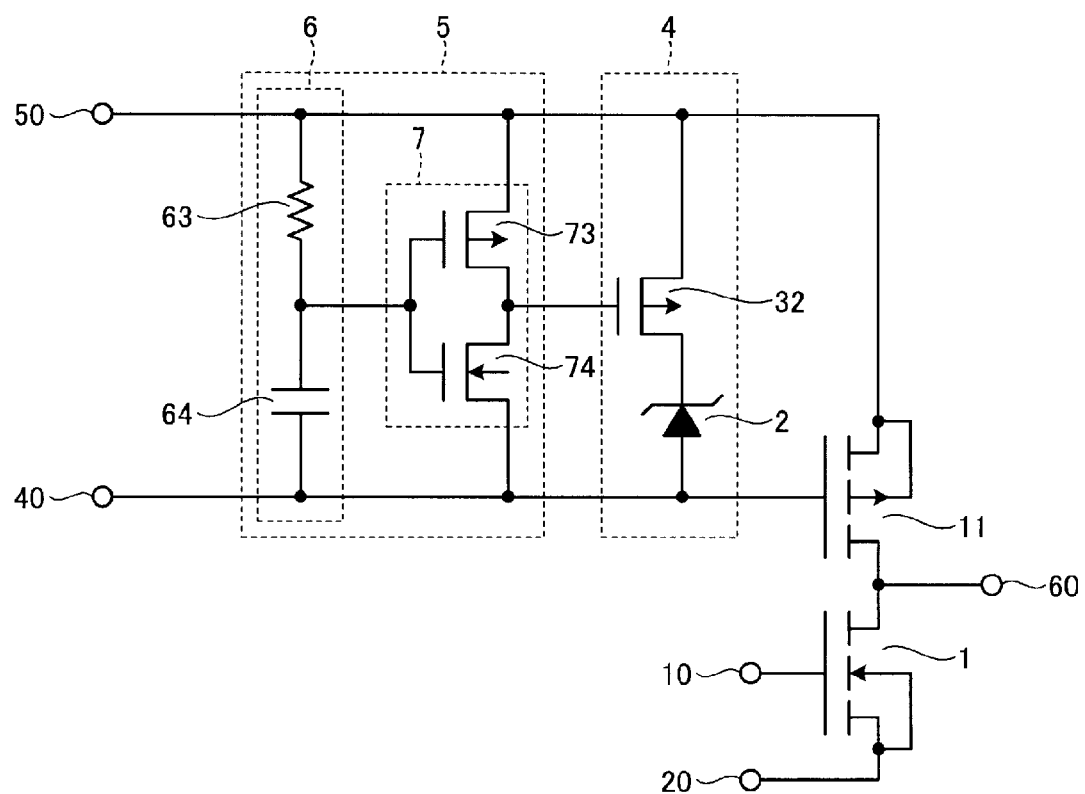
FIG. 3 is a circuit diagram showing a semiconductor device according to a second embodiment.

FIG. 3 is a circuit diagram showing a semiconductor device according to a second embodiment. The components in this embodiment similar to the components in the embodiment shown in FIG. 2 are given same reference numbers, and the same explanation is not repeated. This embodiment uses the P-type DMOS transistor 11 including a gate electrode, a source electrode, and a drain electrode as a power output element. The gate electrode of the P-type DMOS transistor 11 is connected to the fourth terminal 40. The fourth terminal 40 receives an output signal from the internal circuit (not shown) which outputs a driving signal for driving the P-type DMOS transistor 11. The source electrode of the P-type DMOS transistor 11 is connected to the fifth terminal 50. The fifth terminal 50 receives the high potential power-supply voltage (Vdd). The drain electrode of the P-type DMOS transistor 11 is connected to a sixth terminal 60. The sixth terminal 60 supplies output of the P-type DMOS transistor 11. The sixth terminal 60 also is connected to the drain electrode of the N-type DMOS transistor 1. The source electrode of the N-type DMOS transistor 1 is connected to the second terminal 20 which receives the low potential reference voltage (ground potential Vss), and the gate electrode of the N-type DMOS transistor 1 is connected to the first terminal 10. The first terminal 10 receives a driving signal from the internal circuit (not shown). The P-type DMOS transistor 11 operates as a high potential side power output element, and the N-type DMOS transistor 1 operates as a low potential side power output element.

The series circuit 4 having the zener diode 2 for gate protection and a PMOS transistor 32 is connected between the gate and source electrodes of the P-type DMOS transistor 11. The source electrode of the PMOS transistor 32 is connected to the fifth terminal 50, and the drain electrode of the PMOS transistor 32 is connected to the cathode electrode of the zener diode 2. The anode electrode of the zener diode 2 is connected to the gate electrode of the P-type DMOS transistor 11. In this structure, the series connection of the zener diode 2 and the source and drain channels of the PMOS transistor 32 connects between the gate and source electrodes of the P-type DMOS transistor 11.

The control circuit 5 having the predetermined time constant connects between the gate and source electrodes of the P-type DMOS transistor 11. The control circuit 5 has the bias circuit 6 and the switching circuit 7. The bias circuit 6 has a resistor 63 and a capacitor 64 connecting in series between the fifth terminal 50 and the fourth terminal 40. The switching circuit 7 has a CMOS inverter circuit constituted by a PMOS transistor 73 and an NMOS transistor 74. The source electrode of the PMOS transistor 73 is connected to the fifth terminal 50. The drain electrode of the PMOS transistor 73 is connected to the drain electrode of the NMOS transistor 74, and the source electrode of the NMOS transistor 74 is connected to the fourth terminal 40. The gate electrodes of the PMOS transistor 73 and the NMOS transistor 74 have common connection which is connected to the connections of the resistor 63 and the capacitor 64 of the bias circuit 6. The output of the switching circuit 7 enters the gate electrode of the PMOS transistor 32.

The series circuit of the capacitor 64 and the resistor 63 constituting the bias circuit 6 forms a differentiating circuit. Assuming that the capacity of the capacitor 64 is C farad (F) and that the resistance of the resistor 63 is R ohm (Ω), the time constant of the bias circuit 6 is calculated as C×R. The bias circuit 6 constituting the differentiating circuit responds to the signal applied between the fourth terminal 40 and the fifth terminal 50. When a pulse signal having a voltage different from the voltage of the fifth terminal 50 by E volt (V) (a pulse signal having an effective voltage lower than the voltage of the fifth terminal 50 by E volt) is applied to the fourth terminal 40, the bias circuit 6 responds to falling of the pulse signal, whereby current which has an initial value of (E/R) ampere (A) and decreases as an exponential function of the time constant (C×R), flows in the resistor 63. When the voltage drop at the resistor 63 produced by the flow of the current exceeds the threshold of the PMOS transistor 73 at which a current flows between the source and the drain, the PMOS transistor 73 is turned on, whereupon a high level output signal is supplied from the switching circuit 7 to the gate electrode of the PMOS transistor 32. As a result, the PMOS transistor 32 is turned off. Under the off condition of the PMOS transistor 32, the impedance between the cathode electrode of the zener diode 2 for gate protection and the fifth terminal 50 is high. In this condition, the zener diode 2 does not clamp the voltage between the gate and source electrodes of the P-type DMOS transistor 11. Accordingly, the gate electrode of the P-type DMOS transistor can receive the pulse voltage for the HV screening. After the application of high voltage for the HV screening, the screening processes as follow are conducted: a test for checking whether the semiconductor device normally functions or not, a test for checking the presence or absence of leakage current, and other tests to determine the semiconductor as a good product or a faulty product.

When the voltages at both ends of the capacitor 64 of the bias circuit 6 increase as an exponential function and exceed the threshold of the NMOS transistor 74 at which a current flows between the drain and the source, the NMOS transistor 74 is turned on. When the NMOS transistor 74 is turned on, a low level signal is applied to the gate electrode of the PMOS transistor 32. As a result, the PMOS transistor 32 is turned on, whereby the impedance between the cathode electrode of the zener diode 2 and the fifth terminal 50 becomes low. Accordingly, the zener diode 2 clamps the voltage between the gate and source electrodes of the P-type DMOS transistor 11.

According to this embodiment, the control circuit 5 responds to the pulse signal applied to the gate electrode of the P-type DMOS transistor 11, and controls on and off of the switch element 32 connected with the zener diode 2 for gate protection. Accordingly, the gate electrode of the P-type DMOS transistor 11 connecting with the zener diode 2 for gate protection can receive high voltage pulses for the HV screening of the semiconductor device without using a special external terminal for controlling the switch element. The control circuit 5 having the predetermined time constant controls on and off of the switch element 32 connected with the gate protection element in response to falling of the voltage pulse for the HV screening.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device, comprising:
   a first transistor comprising a source electrode, a drain electrode, and a gate electrode;
   a diode and a switch element connected in series between the gate and source electrodes of the first transistor; and
   a control circuit configured to supply a control signal for switching the switch element;

wherein the control circuit has a predetermined time constant and is configured to supply the control signal to the switch element to turn off the switch element for a predetermined time period, if a pulse signal having a voltage that is equal to or higher than a predetermined voltage is supplied to the gate electrode of the first transistor.

2. The semiconductor device according to claim 1, wherein the control circuit comprises:
a bias circuit including a capacitor and a resistor connected in series between the source and gate electrodes of the transistor, and
a switching circuit configured to switch ON/OFF state of the switch element based on a voltage between the capacitor and the resistor.

3. The semiconductor device according to claim 2, wherein the switching circuit is a CMOS inverter circuit.

4. The semiconductor device according to claim 3, wherein the CMOS inverter circuit comprises a P-type transistor and an N-type transistor, the gate electrodes of the P-type transistor and the N-type transistor being connected to each other, and the drain electrodes of the P-type transistor and the N-type transistor being connected to each other.

5. The semiconductor device according to claim 4, wherein the switch element is a transistor comprising a gate electrode, a source electrode, and a drain electrode,
the drain electrodes of the P-type transistor and the N-type transistor are connected to the gate electrode of the transistor comprising the switch element.

6. The semiconductor device according to claim 5, wherein source and drain channels of the transistor comprising the switch element are connected in series to the diode.

7. The semiconductor device according to claim 1, wherein the switch element is a second transistor comprising a gate electrode, a source electrode, and a drain electrode,
source and drain channels of the second transistor are connected in series to the diode, and
the gate electrode of the second transistor is configured to receive the control signal supplied from the control circuit.

8. The semiconductor device according to claim 1, wherein the predetermined voltage is higher than a voltage used during operation of the semiconductor device.

9. The semiconductor device according to claim 8, wherein,
the first transistor includes a gate insulation film and the predetermined voltage is a voltage at which a gate insulation film of the first transistor can break.

10. A semiconductor device, comprising:
a first transistor;
a diode and a semiconductor element connected in series between a gate electrode and a source electrode of the first transistor; and
a control circuit configured to control a resistance of the semiconductor element,
wherein the control circuit has a predetermined time constant and is configured to increase the resistance of the semiconductor element if a pulse signal having a voltage that is equal to or higher than a predetermined voltage is supplied to the gate electrode of the first transistor.

11. The semiconductor device according to claim 10, wherein the control circuit comprises:
a bias circuit including a capacitor and a resistor connected between the source and gate electrodes of the transistor, and
a switching circuit configured to switch the resistance of the semiconductor element based on the output of the bias circuit.

12. The semiconductor device according to claim 11, wherein
the switching circuit is a CMOS inverter circuit.

13. The semiconductor device according to claim 12, wherein
the CMOS inverter circuit comprises a P-type transistor and an N-type transistor, the gate electrodes of the P-type transistor and the N-type transistor being connected, and the drain electrodes of the P-type transistor and the N-type transistor being connected.

14. The semiconductor device according to claim 10, wherein
the semiconductor element is a second transistor comprising a gate electrode, a source electrode, and a drain electrode,
source and drain channels of the second transistor comprising the semiconductor element are connected to the diode in series, and the gate electrode of the second transistor is configured to receive a signal supplied from the control circuit.

15. A semiconductor device, comprising:
a first transistor comprising a first electrode, a second electrode, and a gate electrode;
a capacitor and a resistor connected in series between the gate and first electrodes of the first transistor,
an inverter circuit comprising a P-type transistor and an N-type transistor connected in series between the gate and first electrodes of the first transistor, each gate electrode of the P-type transistor and the N-type transistor being connected to each other and being connected to a connection point between the capacitor and the resistor, and
a diode and a second transistor connected in series between the gate and first electrodes of the first transistor, a gate electrode of the second transistor being connected to a connection point between the P-type transistor and the N-type transistor.

16. The semiconductor device according to claim 15, wherein the first and the second transistors are N-type MOS transistors and the gate electrode of the first transistor is connected to the capacitor, the P-type transistor, and a cathode of the diode.

17. The semiconductor device according to claim 15, wherein the first and the second transistors are P-type MOS transistors and the gate electrode of the first transistor is connected to the capacitor, the N-type transistor, and an anode of the diode.

18. The semiconductor device according to claim 15, wherein the second transistor is OFF for a predetermined time period if a pulse signal having a voltage that is equal to or higher than a predetermined voltage is supplied to the gate electrode of the second transistor.

19. The semiconductor device according to claim 15, wherein the second transistor is switched to an ON state from an OFF state after a predetermined time period, if a pulse signal having a voltage that is equal to or higher than a predetermined voltage is supplied to the gate electrode of the transistor.

* * * * *